US007033708B2

(12) United States Patent
Tejnil

(10) Patent No.: US 7,033,708 B2
(45) Date of Patent: Apr. 25, 2006

(54) IMAGE FOCUS MONITOR FOR ALTERNATING PHASE SHIFT MASKS

(75) Inventor: Edita Tejnil, San Carlos, CA (US)

(73) Assignee: Intel Corporation, Santa Clara, CA (US)

( * ) Notice: Subject to any disclaimer, the term of this patent is extended or adjusted under 35 U.S.C. 154(b) by 59 days.

(21) Appl. No.: 10/442,432

(22) Filed: May 20, 2003

(65) Prior Publication Data

US 2004/0234869 A1     Nov. 25, 2004

(51) Int. Cl.
*G03F 1/00* (2006.01)
*G03F 7/207* (2006.01)
*C03B 23/00* (2006.01)
*G01B 11/14* (2006.01)

(52) U.S. Cl. .................. 430/5; 355/61; 216/12; 356/624; 356/401

(58) Field of Classification Search .................. 430/5, 430/322–324; 355/18, 53, 60–62; 378/34–35; 216/12; 356/624, 399, 401; 382/144, 151, 382/255
See application file for complete search history.

(56) References Cited

U.S. PATENT DOCUMENTS 5,300,786 A * 4/1994 Brunner et al. ............. 250/548
6,440,616 B1 * 8/2002 Izuha et al. ..................... 430/5
2004/0029023 A1 * 2/2004 Misaka ........................... 430/5

OTHER PUBLICATIONS

Levinson, Harry J., Principles of Lithography, 2001, SPIE—The International Society of Optical Engineering, p. 274, formula 8.18.*

* cited by examiner

*Primary Examiner*—Mark F. Huff
*Assistant Examiner*—John Ruggles
(74) *Attorney, Agent, or Firm*—Fish & Richardson P.C.

(57) ABSTRACT

A focus monitor on an alternating phase shift mask may include sub-wavelength features which have a depth corresponding to an etch depth of primary features on the mask (e.g., a 180° etch depth), but which produce an effective phase shift of about 60° to 120°.

21 Claims, 6 Drawing Sheets

IMAGE FOCUS MONITOR FOR ALTERNATING PHASE SHIFT MASKS

BACKGROUND

Reliably determining the level of defocus in a printed pattern is an important aspect of photolithography. A common focus monitoring scheme employs a 90° phase shifting transition on a mask. Such a 90° phase transition may be produced by etching a region on a glass mask by a depth that produces a relative phase difference of 90° for light transmitted through the etched and un-etched mask regions. The image intensity may be reduced at the 90° phase edge relative to the clear glass regions of the mask. The location of the intensity minimum near the phase edge is known to shift from one side of its nominal position to another as the image focus is changed from negative to positive defocus. A focus monitor may track the image plane location of a printed line that straddles a 90° phase step on a mask.

DETAILED DESCRIPTION

Figure 1:
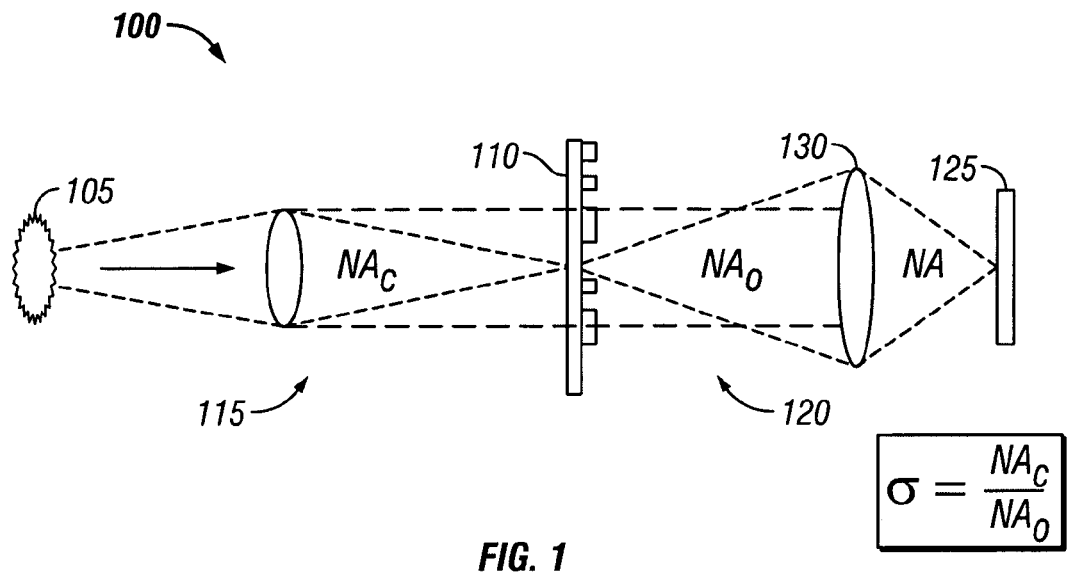
FIG. 1 is a block diagram of a lithography system.

FIG. 1 shows a photolithography system 100. Light from an illumination source 105 is transferred to a patterned mask 110, or reticle, by an illumination system 115. Light passes through the mask and into the entrance pupil of an imaging system 120. The resulting pattern is imaged onto a photoresist covered wafer 125 by a lens 130 in the imaging system. The wafer may be held in position by a vacuum hold device (or chuck), the position of which may be controlled by an X,Y,Z location controller or stepper motor.

In order to effectively transfer the mask pattern to the wafer, the image must be adequately focused on the surface to be exposed. Focus is typically quantified as an offset error in the location of the wafer (or, more particularly, the surface to be exposed) in the Z-axis dimension relative to a perfectly focused image plane. This focus offset (or "defocus") may have a positive or negative Z-axis displacement with respect to the ideal focal plane, along with a magnitude representative of the distance by which the surface is offset from the ideal focal plane (measured, for example, in micrometers). Accurate adjustment of the wafer for proper focus may be achieved by determining the direction of defocus (i.e., the positive or negative Z-axis translation of the wafer), along with an actual offset displacement measurement.

A common focus monitoring scheme employs a 90° phase shifting transition on a mask. Such a 90° phase transition may be produced by etching a region on a glass mask by a depth that produces a relative phase difference of 90° for light transmitted through the etched and unetched mask regions. The image intensity may be reduced at the 90° phase edge relative to the clear glass regions of the mask. The location of the intensity minimum near the phase edge is known to shift from one side of its nominal position to another as the image focus is changed from negative to positive defocus. A focus monitor may track the image plane location of a printed line that straddles a 90° phase step on a mask.

The mask 110 may be an alternating phase shift mask (alt-PSM), which includes a 90° phase shifting region for focus monitoring. The 90° phase shifting region may be in a frame region, e.g., over a wafer scribe line, so as not to interfere with the integrated circuit device regions on the wafer.

Figure 2:
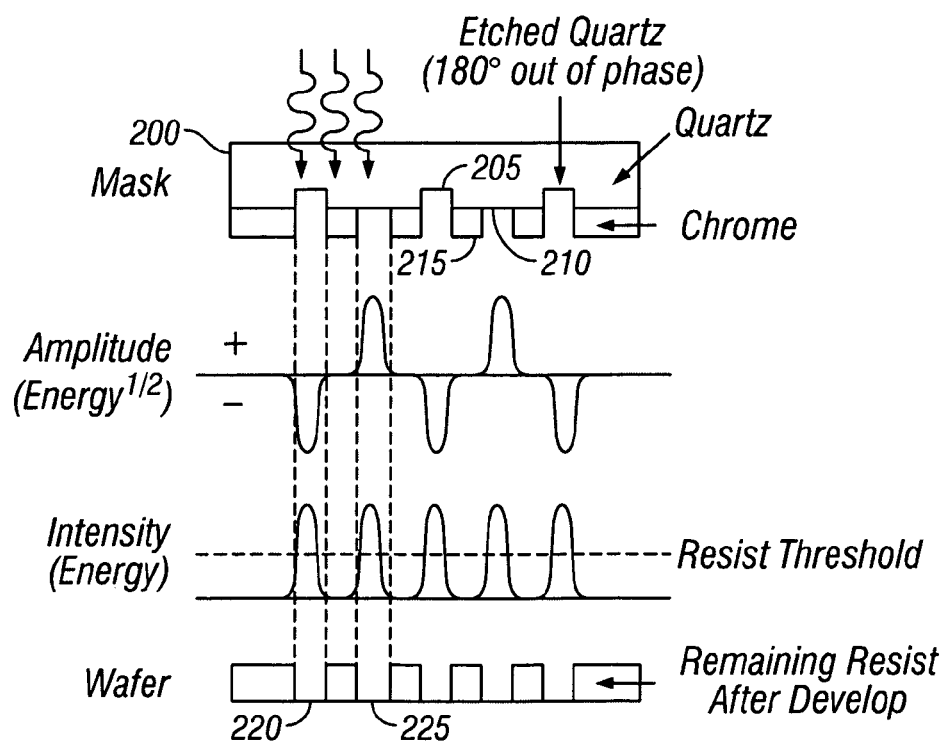
FIG. 2 is a sectional view of an alternating phase shift mask.

FIG. 2 shows an exemplary alt-PSM 200. In the alt-PSM, alternating clear regions 205 and 210 may have different step heights which cause the light to be phase-shifted 180°. As a consequence, the light diffracted into the nominally dark area 215 from the clear area 205 to the left will interfere destructively with the light diffracted from the right clear area 210. This may improve image contrast on the wafer.

Figure 3:
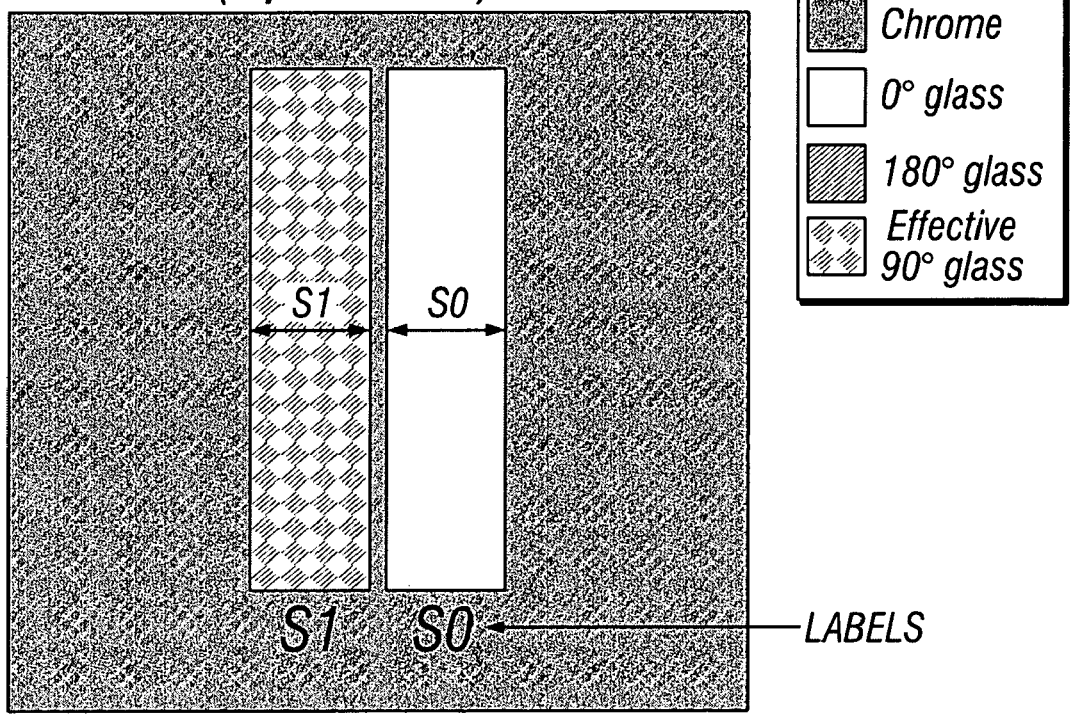
FIG. 3 is a top view of a mask including a 90° effective phase shift region.
Figure 4A:
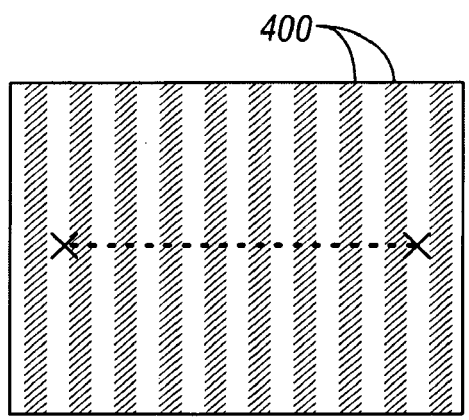
FIGS. 4A–4D are top views of phase shifting regions including sub-wavelength features.
Figure 4B:
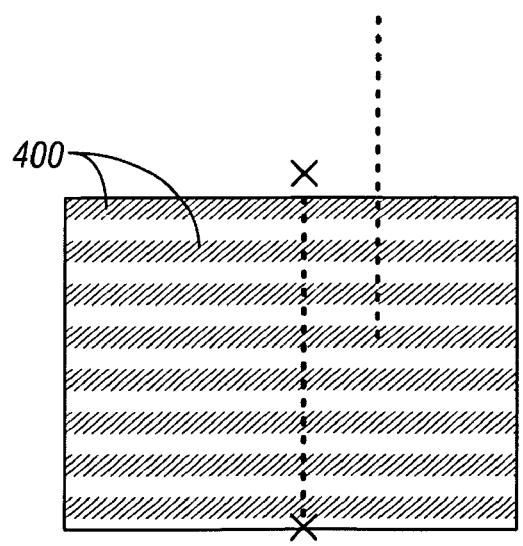
Figure 4C:
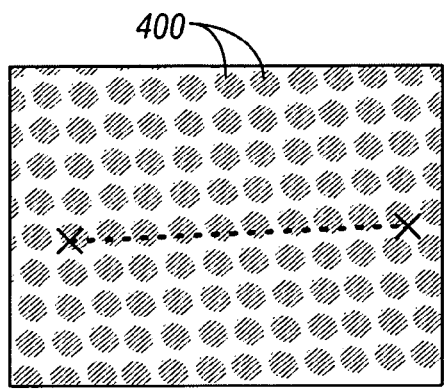
Figure 4D:
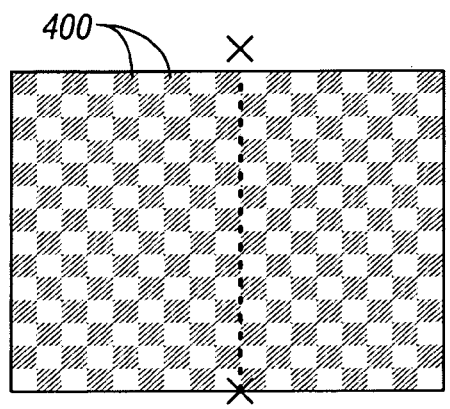
Figure 5:
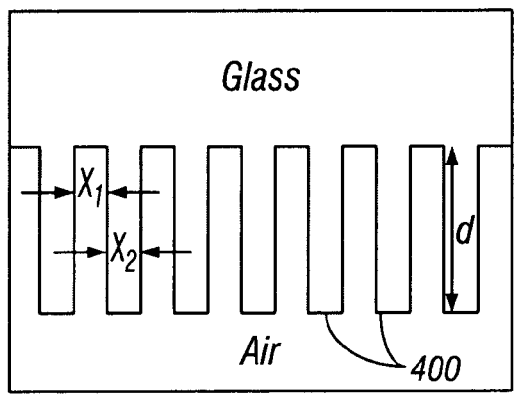
FIG. 5 is a cross-sectional view of a phase shifting region in FIGS. 4A–4D.

The 90° phase shifting region may include sub-wavelength structures, as shown in FIG. 3, to produce an effective phase shift of 90° with features created using an etch depth typically used in the primary (patterned) area of the mask to produce a 180° phase shift. This may enable the sub-wavelength structures for the effective 90° phase shift to be produced in the same etching step used to produce the primary (180°) alternating phase shift mask features (i.e., steps). FIGS. 4A–4D show exemplary patterns in the 90° phase shifting region. FIG. 5 is a cross-sectional view of the phase shifting region taken along the line X—X in FIGS. 4A–4D. The features in the 90° effective phase shifting region may have a depth corresponding to a 180° phase shift, e.g., $d=\lambda/2(n-1)$, where d is the etch depth, $\lambda$ is the wavelength of the incident light, and n is the refractive index of the glass. The sub-wavelength features 400 may be significantly smaller than the wavelength of the light used for the lithographic exposure of the mask. The width of the features ($x_2$) and the spaces between features ($x_1$) may be less than about half of the wavelength of the incident light, i.e., $x_1 \sim x_2 < \sim \lambda/2$.

Figure 6A:
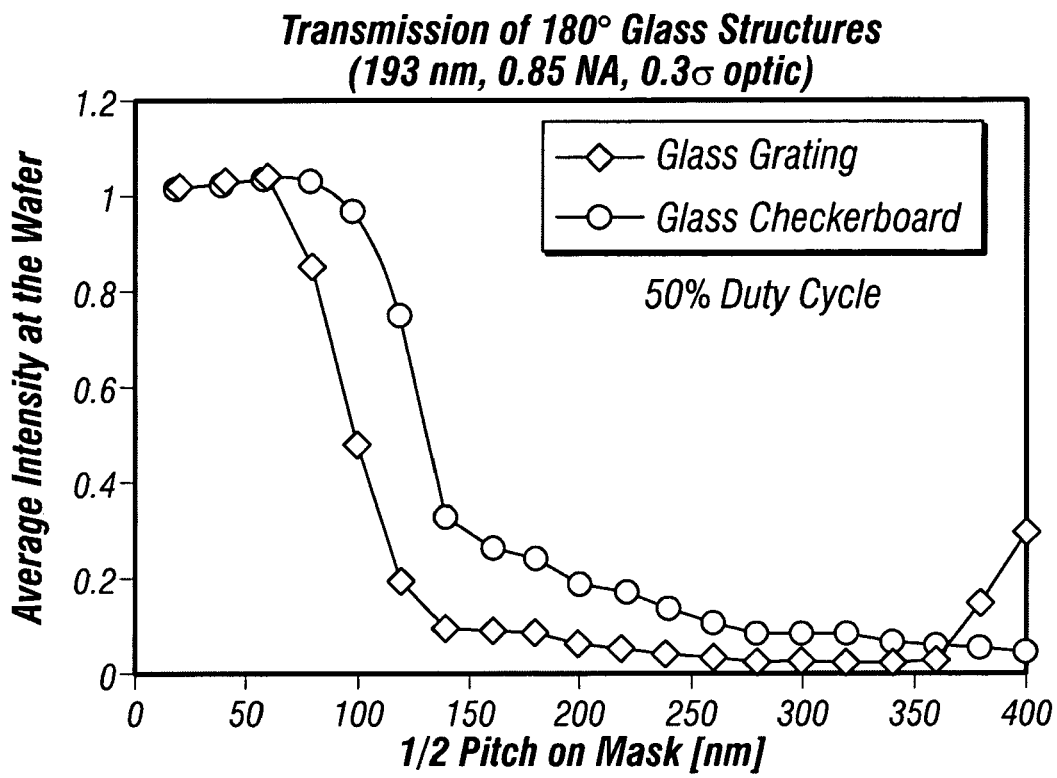
FIGS. 6A and 6B show the transmission and phase of glass structures etched to a depth that corresponds to phase steps of 180° vs. the feature size at the mask.
Figure 6B:
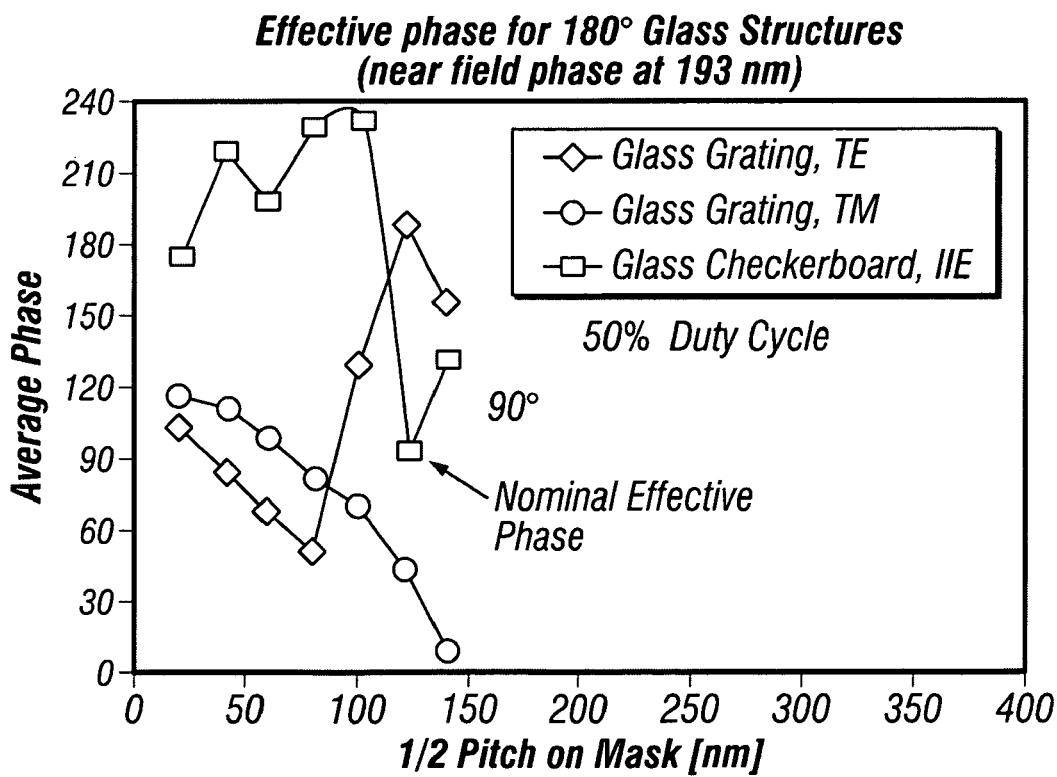

The principle behind the effective phase shifting effect is that deep sub-wavelength features may not be effectively sampled by the incident electromagnetic wave, and as a result, their electromagnetic properties are effectively their spatially averaged properties. This may be represented by the expression $$\phi \approx \phi_{etch} * \frac{area_{etched}}{area_{phaseshiftedregion}}$$

where $\phi$ is the approximate effective phase shift, $\phi_{etch}$ is the typical phase shift for the etch depth, and $$\frac{area_{etched}}{area_{phaseshiftedregion}}$$

is the ratio of the area of the etched regions in the phase shifting region to the entire area of the phase shifting region (also referred to here as the "duty cycle"). For instance, a sub-wavelength glass grating with a step height that corresponds to a 180° phase shift and a 50% duty cycle, effectively responds to the electromagnetic wave as a region with a 90° phase shift. In general, the exact phase shift produced in a region with sub-wavelength structures must be measured experimentally or calculated by numerically solving Maxwell's equations for the case of light propagating through the mask. FIG. 6A shows the transmission of a glass grating (FIG. 4A or B) and of a glass checkerboard (FIG. 4D), each etched to a depth that corresponds to a phase shift of 180°, vs. the feature size at the mask. FIG. 6B shows the calculated effective phase shift produced by a glass grating and a glass checkerboard etched to a depth that corresponds to phase shift of 180° vs. the feature size at the mask. In the case of the grating in FIG. 6B, the approximate formula for the effective phase in the sub-wavelength feature regime is relatively accurate. However, in the case of the checkerboard in FIG. 6B, the approximate formula is not very accurate and the effective phase must be determined by either a simulation or an experiment.

The duty cycle of the grating may determine the effective phase shift and may be adjusted if a different phase shift is desired. For example, a focus monitor may provide good results with an effective phase shift of 60° to 120° (±m× 180°), where m is an integer. The critical property of the sub-wavelength features is lateral size and average height corresponding to the effective phase shift. The lateral shape and configuration of the structures may not be important as long as their average height is approximately constant over a wavelength. The lateral size of the structures, including both the etched areas and the remaining unetched features, may need to be smaller than about $\lambda/2$, where $\lambda$ is the wavelength of the incident light. The performance of the phase shifting region may be significantly improved if the structures have lateral dimensions of roughly $\lambda/3$ or smaller. For 193-nm wafer exposures, the phase shift focus monitor features may need to be in the sub-100 nm regime.

Figure 7:
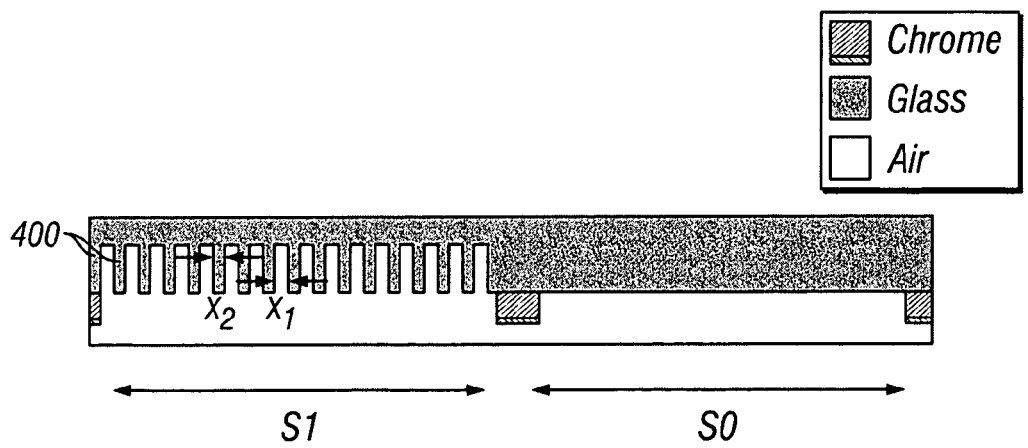
FIG. 7 shows a cross sectional view of one implementation of the phase shift mask focus monitor.
Figure 8A:
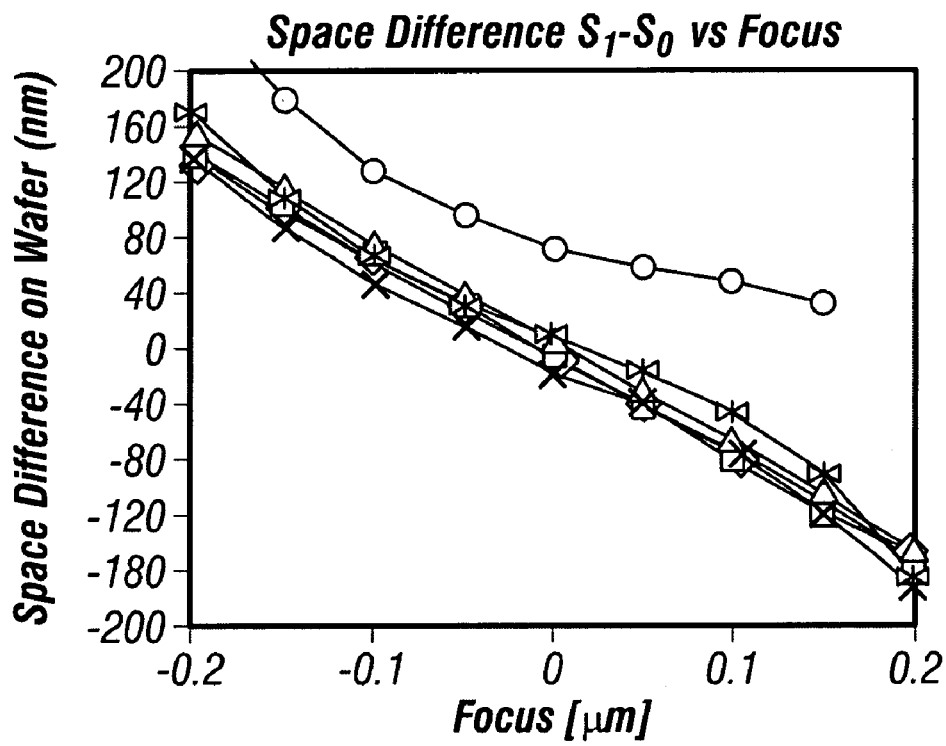
FIGS. 8A and 8B show the performance of the phase shift mask focus monitor in FIG. 7 measured at the wafer plane.
Figure 8B:
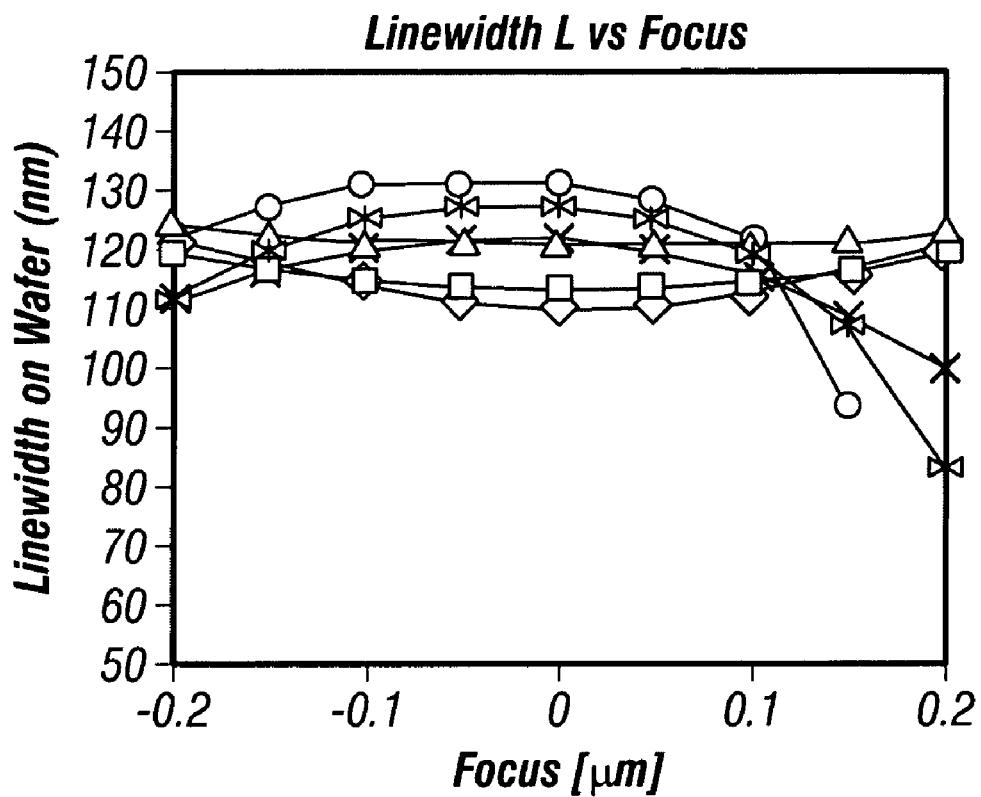

FIG. 7 shows a cross sectional view of one implementation of the phase shift mask focus monitor. The sub-wavelength features 400 may be in a space region S1 adjacent to an unshifted (0°) space region S0. FIGS. 8A and 8B show the performance of the phase shift focus monitor in FIG. 7 measured at the wafer plane. The space difference S1–S0 varies approximately linearly with the exposure tool focus for feature sizes $x_1$, $x_2$ up to about 70 nm for 193-nm exposures. For larger mask features $x_1$, $x_2$ in the etched region, up to ~100 nm in lateral dimension, the space difference S1–S0 may still be a strong function of focus. In this regime, S1–S0 S0 becomes nonlinear and highly sensitive to the exposure dose. For mask feature sizes above about $\lambda/2$, or ~100 nm for 193-nm exposures, the monitor structure loses the strong sensitivity to defocus.

By providing a focus monitor with an effective phase shift of, e.g., 60° to 120° using features having the same etch depth as the primary features in the mask, e.g., a 180° etch depth, the focus monitor may be produced on the mask using fewer processing steps and at lower cost than by producing a focus monitor by etching the features to a depth corresponding to a 60° to 120° phase shift.

As used herein, the term "light" refers to light used in photolithography. The terms "light" and "photolithography" in the specification need not be restricted to visible light, but can also embrace other forms of radiation and lithography.

Although the focus monitor has been described in relation to alt-PSMs, the focus monitor may be used with other mask structures. For example, the mask may be a reflective mask including thin film phase shifting features to shift the phase of the incident light. Such a mask may be used for, e.g., extreme ultraviolet lithography (EUVL).

A number of embodiments have been described. Nevertheless, it will be understood that various modifications may be made without departing from the spirit and scope of the invention. Accordingly, other embodiments are within the scope of the following claims.

The invention claimed is:

1. An apparatus comprising:
   a mask including an etching area having primary features with a nominal phase shift of 180°, and a focus monitor including a region to produce an effective phase shift other than 180° to incident light having a wavelength, the region including a plurality of sub-wavelength features having a lateral dimension on the mask which is smaller than the wavelength of incident light and which causes the effective phase shift other than 180° to the incident light.

2. The apparatus of claim 1, wherein the lateral dimension of mask features is less than about one half of the wavelength of the incident light.

3. The apparatus of claim 1, wherein the wavelength of the incident light is about 193 nm and the lateral feature dimension is less than 100 nm.

4. The apparatus of claim 1, wherein the mask comprises a transmissive material having a surface, and
   wherein the plurality of features are recessed at a depth from the surface.

5. The apparatus of claim 1, wherein the effective phase shift is in a range of from about 60° to 120° (±m×180°), where m is an integer.

6. The apparatus of claim 1, wherein the effective phase shift is about 90°.

7. The apparatus as in claim 1, wherein an amount of the effective phase shift other than 180° in the focus monitor region is proportional to a ratio between the etched area and the entire area of the phase shifted focus monitor region.

8. An apparatus comprising:
   a mask including
   a focus monitor including a region to produce an effective phase shift to incident light having a wavelength, the region including a plurality of features having a lateral dimension on the mask smaller than the wavelength of incident light wherein the mask has primary features outside of the focus monitor, the primary features having a depth operative to cause a 180° phase shift to the incident light wherein the plurality of features in the focus monitor have a depth approximately equal to the depth of the primary features.

9. An apparatus comprising:
   a mask including
   a focus monitor including a region to produce an effective phase shift to incident light having a wavelength, the region including a plurality of features having a lateral dimension on the mask smaller than the wavelength of incident light wherein the mask has primary features outside of the focus monitor, the primary features having a depth operative to cause a 180 phase shift to the incident light wherein the plurality of features have a duty cycle of about 50%.

10. A method comprising:
    etching primary features into a surface of a phase shift mask, the primary features being etched to a depth operative to cause incident light to be phase shifted about 180°; and
    etching a plurality of secondary features in a focus monitor region on the phase shift mask, the secondary features having a lateral dimension less than about half a wavelength of the incident light and a depth approximately equal to the depth of the primary features wherein the etching of the primary features and the etching of the plurality of features in the focus monitor region are performed in the same etching step.

11. The method of claim 10, wherein the plurality of features in the focus monitor region have a lateral dimension and duty cycle operative to cause a phase shift in a range of about 60° to 120° (±m×180°), where m is an integer.

12. The method of claim 10, wherein the plurality of features in the focus monitor region have a lateral dimension and duty cycle operative to cause a phase shift of about 90°.

13. A phase shift mask comprising:
a plurality of primary features to cause incident light having a wavelength to be phase shifted about 180°; and
a focus monitor region including a plurality of secondary sub-wavelength features, plurality of secondary sub-wavelength features having a dimension on the mask smaller than the wavelength of the incident light that causes an effective phase shift other than 180° to the incident light.

14. The phase shift mask of claim 13, wherein the focus monitor region is operative to produce an effective phase shift of between about 60° and 120° (±m×180°), where m is an integer.

15. The phase shift mask of claim 13, wherein the focus monitor region is operative to produce an effective phase shift of about 90°.

16. The phase shift mask of claim 13, wherein the lateral dimension is less than about one half of the wavelength of the incident light.

17. The phase shift mask of claim 13, wherein the wavelength of the incident light is about 193 nm and the lateral dimension is less than 100 nm.

18. The phase shift mask of claim 13, wherein the mask comprises a transmissive material having a surface, and
wherein the primary features are recessed in the surface by a depth operative to cause the 180° phase shift to the incident light.

19. The phase shift mask as in claim 13, wherein an amount of said effective phase shift other than 180° in the focus monitor region is proportional to a duty cycle between the etched area and the entire area of the phase shifted focus monitor region.

20. A phase shift mask comprising:
a plurality of primary features to cause incident light having a wavelength to be phase shifted about 180°; and
a focus monitor region including a plurality of secondary features having a dimension on the mask smaller than the wavelength of the incident light, wherein the plurality of secondary features in the focus monitor have a depth approximately equal to the depth of the primary features.

21. A phase shift mask comprising:
a plurality of primary features to cause incident light having a wavelength to be phase shifted about 180°; and
a focus monitor region including a plurality of secondary features having a dimension on the mask smaller than the wavelength of the incident light, wherein the plurality of features have a duty cycle of about 50%.

* * * * *